United States Patent
Calzia et al.

(10) Patent No.: US 8,513,052 B2
(45) Date of Patent: Aug. 20, 2013

(54) DICHALCOGENIDE SELENIUM INK AND METHODS OF MAKING AND USING SAME

(71) Applicant: Rohm and Haas Electronic Materials LLC, Marlborough, MA (US)

(72) Inventors: Kevin Calzia, Maynard, MA (US); David Mosley, Philadelphia, PA (US); Charles R. Szmanda, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/650,574

(22) Filed: Oct. 12, 2012

(65) Prior Publication Data

US 2013/0034933 A1    Feb. 7, 2013

Related U.S. Application Data

(62) Division of application No. 12/509,847, filed on Jul. 27, 2009, now Pat. No. 8,308,973.

(51) Int. Cl.
    *H01L 21/06* (2006.01)
(52) U.S. Cl.
    USPC ............................................. 438/102
(58) Field of Classification Search
    USPC ............................................. 438/102
    See application file for complete search history.

(56) References Cited

U.S. PATENT DOCUMENTS 7,094,651 B2 *   8/2006   Mitzi et al. ................ 438/285

* cited by examiner

*Primary Examiner* — Ling Choi
*Assistant Examiner* — Monique Peets
(74) *Attorney, Agent, or Firm* — Thomas S. Deibert

(57) ABSTRACT

A method for preparing a Group 1a-1b-3a-6a material using a selenium ink comprising a chemical compound having a formula $RZ-Se_x-Z'R'$ stably dispersed in a liquid carrier is provided, wherein the selenium ink is hydrazine free and hydrazinium free.

6 Claims, No Drawings

DICHALCOGENIDE SELENIUM INK AND METHODS OF MAKING AND USING SAME

This application is a divisional of U.S. patent application Ser. No. 12/509,847 filed Jul. 27, 2009.

The present invention relates to a selenium ink comprising a chemical compound having a formula RZ—Se$_x$—Z'R' stably dispersed in a liquid carrier. The present invention further relates to a method of preparing the selenium ink and for using the selenium ink to deposit selenium on a substrate.

Selenium is deposited onto substrates for use in a variety of chalcogenide containing semiconductor materials, for example, thin film transistors (TFTs), light emitting diodes (LEDs); and photo responsive devices {e.g., electrophotography (e.g., laser printers and copiers), rectifiers, photographic exposure meters and photovoltaic cells}. Selenium is also deposited onto substrates for use in the manufacture of phase change alloys for use in phase change memory devices.

One very promising application for selenium is in the manufacture of photovoltaic cells for the conversion of sunlight into electricity. In particular, the use of selenium in the manufacture of photovoltaic cells based on Group 1a-1b-3a-6a mixed-metal chalcogenide materials, including for example, copper-indium-diselenide (CuInSe$_2$), copper-gallium-diselenide (CuGaSe$_2$) and copper-indium-gallium-diselenide (CuIn$_{1-x}$Ga$_x$Se$_2$), are of considerable interest because of their high solar energy to electrical energy conversion efficiencies. The Group 1a-1b-3a-6a mixed metal chalcogenide semiconductors are sometimes referred to generically as CIGS materials. Conventional CIGS solar cells include a back electrode followed by a layer of molybdenum, a CIGS absorber layer, a CdS junction partner layer, and a transparent conductive oxide layer electrode (e.g., ZnO$_x$ or SnO$_2$); wherein the molybdenum layer is deposited over the back electrode, the CIGS absorber layer is interposed between the molybdenum layer and the CdS junction partner and the CdS junction partner is interposed between the CIGS absorber layer and the transparent conductive oxide layer electrode.

The CIGS absorber layer used in photovoltaic devices contain an excess of selenium relative to the other constituents of that layer. One challenge for this promising application for selenium is the development of cost-effective manufacturing techniques for producing the CIGS materials. Conventional methods for depositing selenium typically involve the use of vacuum-based processes, including, for example, vacuum-evaporation, sputtering and chemical vapor deposition. Such deposition techniques exhibit low throughput capabilities and high cost. To facilitate the large scale, high throughput, low cost, manufacture of selenium containing semiconductor materials (in particular CIGS materials), it would be desirable to provide solution based selenium deposition techniques.

One solution deposition method for depositing selenium in the manufacture of a CIGS material is disclosed by Mitzi, et al. in *A High-Efficiency Solution-Deposited Thin-Film Photovoltaic Device*, ADVANCED MATERIALS, vol. 20, pp. 3657-62 (2008)("Mitzi I"). Mitzi I discloses the use of a selenium ink comprising hydrazine, inter alia, as a liquid vehicle for depositing selenium in the manufacture of a thin film CIGS layer. Hydrazine, however, is a highly toxic and explosive material. Accordingly, the Mitzi I process has limited value for use in the large scale manufacture of selenium containing semiconductor devices.

An alternative to the hydrazine containing selenium ink described in Mitzi I is disclosed by Mitzi, et al. in *Low-Voltage Transistor Employing a High-Mobility Spin-Coated Chalcogenide Semiconductor*, ADVANCED MATERIALS vol. 17, pp. 1285-89 (2005)("Mitzi II"). Mitzi II discloses the use of a hydrazinium precursor material for deposition of indium selenide to form an indium selenide channel of a thin film transistor. Mitzi II further asserts that its hydrazinium approach is likely extendable to other chalcogenides besides SnS$_{2-x}$Se$_x$, GeSe$_2$, and In$_2$Se$_3$ systems.

The hydrazinium precursor materials disclosed by Mitzi II remove hydrazine from the manufacturing step to produce selenium containing semiconductor films. Notwithstanding, Mitzi II does not eliminate the need for hydrazine. Rather, Mitzi II still utilizes hydrazine in the preparation of the hydrazinium precursor materials. Moreover, hydrazinium ion precursors pose a significant explosion risk, as documented by Eckart W. Schmidt in his book, *Hydrazine and Its Derivatives: Preparation, Properties, and Applications*, JOHN WILEY & SONS pp 392-401 (1984). The presence of numerous metal ions exacerbates the risk of hydrazinium explosion or detonation. This can be a problem because residual hydrazinium salts may accumulate in process equipment during manufacture, presenting an unacceptable safety risk. Hence, there remains a need for a hydrazine free, hydrazinium free, selenium containing ink for use in the manufacture of selenium containing semiconductor materials and phase change alloys.

In one aspect of the present invention, there is provided a selenium ink, comprising: a chemical compound having a formula RZ—Se$_x$—Z'R'; wherein Z and Z' are each independently selected from sulfur, selenium and tellurium; wherein x is 2 to 20; wherein R is selected from H, a C$_{1-20}$ alkyl group, a C$_{6-20}$ aryl group, a C$_{1-20}$alkylhydroxy group, an arylether group and an alkylether group; wherein R' is selected from a C$_{1-20}$ alkyl group, a C$_{6-20}$ aryl group, a C$_{1-20}$ alkylhydroxy group, an arylether group and an alkylether group; and a liquid carrier; wherein the selenium ink comprises ≧1 wt % selenium; wherein the selenium ink is a stable dispersion and wherein the selenium ink is hydrazine and hydrazinium free.

In another aspect of the present invention, there is provided a method of preparing a selenium ink, comprising: providing a selenium; providing an organic chalcogenide; and a liquid carrier; combining the selenium, the organic thiol and the liquid carrier; heating the mixture with agitation to produce a reaction product having a formula:

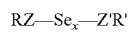

RZ—Se$_x$—Z'R' wherein Z and Z' are each independently selected from sulfur, selenium and tellurium; wherein x is 2 to 20; wherein R is selected from H, a C$_{1-20}$ alkyl group, a C$_{6-20}$ aryl group, a C$_{1-20}$ alkylhydroxy group, an alkylether group and an alkylether group; wherein R' is selected from a C$_{1-20}$ alkyl group, a C$_{6-20}$ aryl group, a C$_{1-20}$alkylhydroxy group, an arylether group and an alkylether group; and, wherein the reaction product is stably dispersed in the liquid carrier; and, wherein the selenium ink is hydrazine free and hydrazinium free.

In another aspect of the present invention, there is provided a method for depositing selenium on a substrate, comprising: providing a substrate; providing a selenium ink according to claim 1; applying the selenium ink to the substrate forming a selenium precursor on the substrate; and treating the selenium precursor to remove the liquid carrier depositing selenium on the substrate.

In another aspect of the present invention, there is provided a method for preparing a Group 1a-1b-3a-6a material, comprising: providing a substrate; optionally, providing a Group 1a source comprising sodium; providing a Group 1b source; providing a Group 3a source; optionally, providing a Group 6a sulfur source; providing a Group 6a selenium source, wherein the Group 6a selenium source includes a selenium ink according to claim 1; forming at least one Group 1a-1b-3a-6a precursor material on the substrate by optionally using the Group 1a source to apply sodium to the substrate, using the Group 1b source to apply a Group 1b material to the substrate, using the Group 3a source to apply a Group 3a material to the substrate, optionally using the Group 6a sulfur source to apply a sulfur material to the substrate and using the Group 6a selenium source to apply a selenium material to the substrate; treating the precursor material to form a Group 1a-1b-3a-6a material having a formula $Na_LX_mY_nS_pSe_q$; wherein X is at least one Group 1b element selected from copper and silver; Y is at least one Group 3a element selected from aluminum, gallium and indium; $0 \leq L \leq 0.75$; $0.25 \leq m \leq 1.5$; n is 1; $0 \leq p < 2.5$; $0 < q \leq 2.5$; and, $1.8 \leq (p+q) \leq 2.5$.

DETAILED DESCRIPTION

The term "stable" as used herein and in the appended claims in reference to the selenium ink means that the chemical compound having a formula $RZ—Se_x—Z'R'$ dispersed in the selenium ink does not undergo significant growth or aggregation. The chemical compound having a formula $RZ—Se_x—Z'R'$ in the stable selenium ink of the present invention remains dispersed in the liquid carrier and can be filtered through a 1.2 micron glass microfiber syringe filter (e.g., Whatman 6886-2512) with no hold up or clogging for a period of at least eight (8) hours, preferably at least sixteen (16) hours, following the preparation of the selenium ink.

The term "hydrazine free" as used herein and in the appended claims in reference to the selenium ink means that the selenium ink contains <100 ppm hydrazine.

The term "hydrazinium free or $(N_2H_5)^+$ free" as used herein and in the appended claims in reference to the selenium ink means that the selenium ink contains <100 ppm hydrazinium complexed with selenium.

The present invention relates to a selenium ink, the preparation of the selenium ink and the use of selenium ink in the manufacture of selenium containing devices such as thin film transistors (TFTs), light emitting diodes (LEDs); phase change alloys for use in memory devices; and photo responsive devices {e.g., electrophotography (e.g., laser printers and copiers), rectifiers, photographic exposure meters and photovoltaic cells}. The following detailed description focuses on the use of the selenium inks of the present invention in the preparation of CIGS materials designed for use in photovoltaic cells.

The selenium ink of the present invention comprises, a chemical compound having a formula $RZ—Se_x—Z'R'$; wherein Z and Z' are each independently selected from sulfur, selenium and tellurium (preferably sulfur and selenium; most preferably sulfur); wherein x is 2 to 20 (preferably 4 to 14); wherein R is selected from H, a $C_{1-20}$ alkyl group, a $C_{6-20}$ aryl group, a $C_{1-20}$ alkylhydroxy group, an arylether group and an alkylether group (preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group); wherein R' is selected from a $C_{1-20}$ alkyl group, a $C_{6-20}$ aryl group, a $C_{1-20}$ alkylhydroxy group, an arylether group and an alkylether group (preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group); and a liquid carrier; wherein the selenium ink comprises $\geq 1$ wt % selenium; wherein the selenium ink is a stable dispersion and wherein the selenium ink is hydrazine and hydrazinium free. Optionally, the R and R' are selected to enhance the solubility of the chemical compound having formula $RZ—Se_x—Z'R'$ in the liquid carrier.

Optionally, Z and Z' are both sulfur. Preferably, when both Z and Z' are sulfur, R and R' are each independently selected from a phenyl group, a methyl group, an ethyl group, a propyl group, a butyl group, an isopropyl group and a tert-butyl group. More preferably, when both Z and Z' are sulfur, R and R' are both a butyl group.

Optionally, Z and Z' are both selenium. Preferably, when both Z and Z' are selenium, R and R' are each independently selected from a phenyl group, a methyl group, an ethyl group, a propyl group, a butyl group, an isopropyl group and a tert-butyl group. More preferably, when both Z and Z' are selenium, R and R' are both a phenyl group.

The selenide content of the selenium ink of the present invention can be selectively provided to suit the particular application need and the processing technology and equipment to be used to apply the selenium ink to a given substrate. Optionally, the selenium ink exhibits a selenide content selected from 1 to 50 wt %; 1 to 5 wt %; 4 to 15 wt % and 5 to 10 wt % (based on the weight of the selenium ink). Optionally, the selenium ink exhibits a selenide content of 1 to 50 wt % (based on the weight of the selenium ink). Optionally, the selenium ink exhibits a selenide content of 1 to 5 wt % (based on the weight of the selenium ink). Optionally, the selenium ink exhibits a selenide content of 4 to 15 wt % (based on the weight of the selenium ink). Optionally, the selenium ink exhibits a selenide content of 5 to 10 wt % (based on the weight of the selenium ink).

The average size of the chemical compound having a formula $RZ—Se_x—Z'R'$ contained in the selenium ink of the present invention can be selectively provided to suit the particular application need and the processing technology and equipment to be used to apply the selenium ink to a given substrate. Optionally, the average size of the chemical compound having formula $RZ—Se_x—Z'R'$ is selected from 0.05 to 10 microns; 0.05 to 1 micron; 0.05 to 0.4 micron; 0.1 to 0.4 micron and <1 micron. Optionally, the chemical compound having formula $RZ—Se_x—Z'R'$ exhibits an average particle size of 0.05 to 10 microns. Optionally, the chemical compound having formula $RZ—Se_x—Z'R'$ exhibits an average particle size of 0.05 to 1 micron. Optionally, the chemical compound having formula $RZ—Se_x—Z'R'$ exhibits an average particle size of 0.05 to 0.4 micron. Optionally, the chemical compound having formula $RZ—Se_x—Z'R'$ exhibits an average particle size of 0.4 micron. The average particle size of the chemical compound having formula $RZ—Se_x—Z'R'$ can be selected to, for example: facilitate the deposition of small particle size chemical compound having formula $RZ—Se_x—Z'R'$ when codepositing with Cu, In and or Ga inks in the preparation of a CIGS material to facilitate intimate mixing of the CIGS components; to facilitate clog free spraying of the selenium ink; or to facilitate extended shelf-life of the selenium ink.

Optionally, the selenium ink of the present invention is a sterically stabilized suspension. That is, the selenium ink is a heterogeneous fluid, wherein the chemical compound having a formula $RZ—Se_x—Z'R'$ comprises a plurality of particles having an average particle size of >1 micron. Preferably, particles of the chemical compound having a formula $RZ—Se_x—Z'R'$ in the sterically stabilized suspension that settle out over time can be readily redispersed. The term "readily redispersible" as used herein and in the appended claims in reference to the selenium ink means that any material settling out of the selenium ink overtime can be redispersed with agitation or sonication (i.e., the settled material does not form persistent agglomerates).

Optionally, the selenium ink is a sol. That is, the selenium ink is a colloidal dispersion, wherein the chemical compound having a formula RZ—$Se_x$—Z'R' comprises a plurality of particles having an average size between 1 to 500 nm.

Optionally, the selenium ink of the present invention is dissolved or dispersed in an aqueous medium comprising the chemical compound RZ—$Se_x$—Z'R', wherein either or both R and R' comprise alkyl ether groups or arylether groups, wherein the ether groups comprise ethylene oxide oligomers with 2-20 repeat units.

Liquid carrier used in the preparation of the selenium ink of the present invention is any solvent in which the chemical compound having formula RZ—$Se_x$—Z'R' is soluble and which does not react with the chemical compound having formula RZ—$Se_x$—Z'R'. Optionally, the liquid carrier is selected from water, ethers, polyethers, amide solvents (e.g., dimethylformamide, dimethylacetamide), N-methylpyrrolidone, keto-solvents (e.g., methylisobutylketone), aryl solvents (e.g., toluene), cresols and xylene. Optionally, the liquid carrier is selected from ethers, polyethers, amide solvents (e.g., dimethylformamide, dimethylacetamide), N-methylpyrrolidone, keto-solvents methylisobutylketone), aryl solvents (e.g., toluene), cresols and xylene. Optionally, the liquid carrier is a nitrogen containing solvent. Optionally, the liquid carrier is a liquid amine having a formula $NR_3$, wherein each R is independently selected from a H, a $C_{1-10}$ alkyl group, a $C_{6-10}$ aryl group, a $C_{3-10}$ cycloalkylamino group (e.g., 1,2-diamino cyclohexane) and a $C_{1-10}$ alkylamino group. Optionally, the liquid carrier used in the preparation of the selenium ink of the present invention is selected from ethylene diamine, diethylenetriamine, triethylenetetramine, n-butylamine, n-hexylamine, octylamine, 2-ethyl-1-hexylamine, 3-amino-1-propanol, pyridine, pyrrolidine, and tetramethylguanidine. Preferably, the liquid carrier used in the preparation of the selenium ink of the present invention is selected from ethylene diamine, diethylenetriamine, triethylenetetramine, n-hexylamine, pyrrolidine and n-butylamine. More preferably the liquid carrier used in the preparation of the selenium ink of the present invention is selected from ethylene diamine, diethylenetriamine, triethylenetetramine, pyrrolidine and n-butylamine. Most preferably the liquid carrier used in the preparation of the selenium ink of the present invention is selected from ethylene diamine and diethylenetriamine.

The selenium ink of the present invention can, optionally, further comprise a cosolvent. Cosolvents suitable for use with the present invention are miscible with the liquid carrier. Preferred cosolvents exhibit a boiling point within 30° C. of the boiling point of the liquid carrier.

The selenium ink of the present invention can, optionally, further comprise at least one optional additive selected from a dispersant, a wetting agent, a polymer, a binder, an antifoaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant (e.g., sodium to improve electrical performance of CIGS materials). Optional additives can be incorporated into the selenium ink of the present invention to, for example, facilitate increased shelf life, to improve flow characteristics to facilitate the method of application to a substrate (e.g., printing, spraying), to modify the wetting/spreading characteristics of the ink onto the substrate, to enhance the compatibility of the selenium ink with other inks used to deposit other components on the substrate (e.g., other constituents of a CIGS material, such as Cu, In, Ga, and S), and to modify the decomposition temperature of the selenium ink.

A method of preparing a selenium ink of the present invention, comprises: providing a selenium; providing an organic chalcogenide and a liquid carrier; combining the selenium, the organic chalcogenide and the liquid carrier; heating the mixture (preferably to a temperature within 25° C. of the boiling point temperature of the liquid carrier) with agitation (preferably for a period of 0.1 to 40 hrs) to produce a reaction product having a formula: RZ—$Se_x$—Z'R'; wherein Z and Z' are each independently selected from sulfur, selenium and tellurium (preferably sulfur and selenium; most preferably sulfur); wherein x is 2 to 20 (preferably 4 to 14); wherein R is selected from H, a $C_{1-20}$ alkyl group, a $C_{6-20}$ aryl group, a $C_{1-20}$alkylhydroxy group, an arylether group and an alkylether group (preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group); wherein R' is selected from a $C_{1-20}$ alkyl group, a $C_{6-20}$ aryl group, a $C_{1-20}$ alkylhydroxy group, an arylether group and an alkylether group (preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group); and, wherein the reaction product is stably dispersed in the liquid carrier; and, wherein the selenium ink is hydrazine free and hydrazinium free.

Preferably, the selenium used in making the selenium ink of the present invention is selenium powder.

Preferably, the selenium used in making the selenium ink of the present invention contributes 1 to 50 wt %, 1 to 20 wt %, 1 to 5 wt %, 4 to 15 wt %, or 5 to 10 wt % of the selenium ink produced.

In the method of preparing a selenium ink of the present invention, the organic chalcogenide provided is preferably selected from a thiol and an organic dichalcogenide. When a thiol is used, the thiol preferably has a formula $R^2$—SH, wherein $R^2$ is selected from a $C_{1-20}$ alkyl group, a $C_{6-20}$ aryl group, a $C_{1-20}$ alkylhydroxy group, an arylether group and an alkylether group; preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group. When an organic dichalcogenide is used, the organic dichalcogenide preferably has a formula RZ—Z'R', wherein R is selected from H, a $C_{1-20}$ alkyl group, a $C_{6-20}$ aryl group, a $C_{1-20}$ alkylhydroxy group, an arylether group and an alkylether group (preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group); wherein R' is selected from a $C_{1-20}$ alkyl group, a $C_{6-20}$ aryl group, a $C_{1-20}$ alkylhydroxy group, an arylether group and an alkylether group (preferably selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably selected from a $C_{1-20}$ alkyl group and a $C_{6-20}$ aryl group; still more preferably a $C_{1-10}$ alkyl group; most preferably a $C_{1-5}$ alkyl group); and, wherein Z and Z' are each independently selected from sulfur, selenium and tellurium; preferably sulfur and selenium; most preferably sulfur. The R groups in the thiol and organic dichalcogenide used can be selected to enhance the solubility of the resulting chemical compound having formula RZ—$Se_x$—Z'R' in the liquid carrier.

Optionally, the method of preparing the selenium ink of the present invention, further comprises: providing a cosolvent; and, combining the cosolvent with the liquid carrier.

Optionally, the method of preparing the selenium ink of the present invention, further comprises: providing at least one optional additive; and, combining the at least one optional additive with the liquid carrier; wherein the at least one optional additive is selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant.

Preferably, in the method of preparing the selenium ink of the present invention, the selenium and the liquid carrier are combined by adding the liquid carrier to the selenium. More preferably, the selenium and liquid carrier are combined using inert techniques, followed with continuous agitation and heating. Preferably, the liquid carrier is maintained at a temperature of 20 to 240° C. during the combining of the liquid carrier and the selenium powder. Optionally, the liquid carrier and selenium can be heated above the melting point of selenium (220° C.) during the combining process.

Preferably, in the method of preparing the selenium ink of the present invention, the timing of the addition of the organic chalcogenide depends on the physical state of the organic chalcogenide used. For solid organic chalcogenides, the solid organic chalcogenide is preferably combined with the selenium before addition of the liquid carrier. For liquid organic chalcogenides, the liquid organic chalcogenide is preferably added to the combined selenium and liquid carrier.

When using a liquid organic chalcogenide, the method of preparing the selenium ink of the present invention optionally further comprises heating the combined selenium and liquid carrier before adding the liquid organic chalcogenide. Preferably, the method of preparing the selenium ink of the present invention optionally further comprises: heating the combined liquid carrier and selenium powder before and during the addition of the liquid organic chalcogenide. More preferably, the combined liquid carrier and selenium powder are maintained at a temperature of 20 to 240° C. during the addition of the liquid organic chalcogenide. Optionally, any liquid organic chalcogenides are added to the combined selenium and liquid carrier by gradually adding the liquid organic chalcogenide to the combined selenium and liquid carrier with continuous agitation, heating and reflux.

In the method of preparing the selenium ink of the present invention, the liquid carrier used is any solvent in which the chemical compound having formula RZ—$Se_x$—Z'R' is soluble and which does not react with the chemical compound having formula RZ—$Se_x$—Z'R'. Optionally, the liquid carrier used is selected from water, ethers, polyethers, amide solvents (e.g., dimethylformamide, dimethylacetamide), N-methylpyrrolidone, keto-solvents (e.g., methylisobutylketone), aryl solvents (e.g., toluene), cresols and xylene. Optionally, the liquid carrier used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols and xylene. Optionally, the liquid carrier is a nitrogen containing amine solvent. Optionally, the liquid carrier used is a liquid amine having a formula $NR_3$, wherein each R is independently selected from a H, a $C_{1-10}$ alkyl group, a $C_{6-10}$ aryl group, a $C_{3-10}$ cycloalkylamino group (e.g., 1,2-diamino cyclohexane) and a $C_{1-10}$ alkylamino group. Optionally, the liquid carrier used in the preparation of the selenium ink of the present invention is selected from ethylene diamine, diethylenetriamine, triethylenetetramine, n-butylamine, n-hexylamine, octylamine, 2-ethyl-1-hexylamine, 3-amino-1-propanol, pyridine, pyrrolidine, and tetramethylguanidine. Preferably, the liquid carrier used in the preparation of the selenium ink of the present invention is selected from ethylene diamine, diethylenetriamine, triethylenetetramine, n-hexylamine, pyrrolidine and n-butylamine. More preferably the liquid carrier used in the preparation of the selenium ink of the present invention is selected from ethylene diamine, diethylenetriamine, triethylenetetramine, pyrrolidine and n-butylamine. Most preferably the liquid carrier used in the preparation of the selenium ink of the present invention is selected from ethylene diamine and diethylenetriamine.

The selenium ink of the present invention can be used in the preparation of a variety of semiconductor materials comprising selenium (e.g., thin layer transistors, solar cells, electrophotography components, rectifiers, photographic exposure meters, photocopying media) and in the preparation of chalcogenide containing phase change memory devices.

The method of depositing selenium on a substrate using a selenium ink of the present invention, comprises: providing a substrate; providing a selenium ink of the present invention; applying the selenium ink to the substrate forming a selenium precursor on the substrate; treating the selenium precursor to remove the liquid carrier depositing selenium on the substrate. Without wishing to be bound by theory, it is believed that the selenium deposited on the substrate by this method has a formal oxidation state of zero (i.e., wherein the selenium deposited on the substrate is $Se^0$).

The selenium ink of the present invention can be deposited onto a substrate using conventional processing techniques such as wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition and spray deposition. Preferably, the selenium ink of the present invention is deposited onto a substrate under an inert atmosphere (e.g., under nitrogen).

Preferably, when treating the selenium precursor to remove the liquid carrier, the selenium precursor is heated to a temperature above the boiling point temperature of the liquid carrier. Optionally, the selenium precursor is heated to a temperature of 5 to 200° C. Optionally, the selenium precursor is heated to a temperature of 5 to 200° C. under vacuum. Optionally, the selenium precursor is heated to a temperature above 220° C., both melting the selenium and volatilizing the liquid carrier to facilitate its removal.

A method of the present invention for preparing a Group 1a-1b-3a-6a material, comprises: providing a substrate; optionally, providing a Group 1a source comprising sodium; providing a Group 1b source; providing a Group 3a source; optionally providing a Group 6a sulfur source; providing a Group 6a selenium source, wherein the Group 6a selenium source includes a selenium ink of the present invention; forming a Group 1a-1b-3a-6a precursor material on the substrate by optionally using the Group 1a source to apply sodium to the substrate, using the Group 1b source to apply a Group 1b material to the substrate, using the Group 3a source to apply a Group 3a material to the substrate, optionally using the Group 6a sulfur source to apply a sulfur material to the substrate and using the Group 6a selenium source to apply a selenium material to the substrate; treating the precursor material to form a Group 1a-1b-3a-6a material having a formula $Na_L X_m Y_n S_p Se_q$; wherein X is at least one Group 1b material selected from copper and silver, preferably copper; Y is at least one Group 3a material selected from aluminum, gallium and indium, preferably indium and gallium; $0 \leq L \leq 0.75$; $0.25 \leq m \leq 1.5$; n is 1; $0 \leq p < 2.5$; and, $0 < q \leq 2.5$. Preferably, $0.5 \leq (L+m) \leq 1.5$ and $1.8 \leq (p+q) \leq 2.5$. Preferably, Y is $(In_{1-b}Ga_b)$, wherein $0 \leq b \leq 1$. More preferably, the Group 1a-1b-3a-6a material is according to the formula $Na_L\text{-}Cu_m In_{(1-d)} Ga_d S_{(2+e)(1-f)} Se_{(2+e)f}$; wherein $0 \leq L \leq 0.75$, $0.25 \leq m \leq 1.5$, $0 \leq d \leq 1$, $-0.2 \leq e \leq 0.5$, $0 < f \leq 1$; wherein $0.5 \leq (L+m) \leq 1.5$ and $1.8 \leq \{(2+e)f+(2+e)(1-f)\} \leq 2.5$. Optionally, one or more of the Group 1a source, Group 1b source, Group 3a source, Group 6a sulfur source and the selenium ink of the present invention are combined. The components of the precursor material can be treated by known methods to form the Group 1a-1b-3a-6a material having formula $Na_L X_m Y_n S_p Se_q$. The components of the precursor material can be treated individually or in various combinations. For example, a selenium ink of the present invention and a Group 1b material source can be sequentially- or co-deposited on a substrate, followed by heating to a temperature of 200 to 650° C. for 0.5 to 60 minutes, followed by deposition of additional selenium ink of the present invention and at least one Group 3a material source onto the substrate, followed by heating to a temperature of 200 to 650° C. for 0.5 to 60 minutes. In another approach, the Group 1a, 1b, 3a and 6a materials are all applied to the substrate before annealing. Annealing temperatures can range from 200 to 650° C. with annealing times of 0.5 to 60 minutes. Optionally, additional Group 6a material can be introduced during the annealing process in the form of at least one of selenium ink of the present invention, selenium vapor, selenium powder and hydrogen selenide gas. The precursor materials can optionally be heated to the annealing temperature by use of a rapid thermal processing protocol, such as with the use of a high-powered quartz lamp, a laser or microwave heating methods. The precursor materials can optionally be heated to the annealing temperature using traditional heating methods, for example in a furnace.

A method of the present invention for preparing a CIGS material, comprises: providing a substrate; providing a copper source; optionally, providing an indium source; optionally, providing a gallium source; optionally, providing a sulfur source and providing a selenium ink of the present invention; forming at least one CIGS precursor layer on the substrate by depositing a copper material on the substrate using the copper source, optionally depositing an indium material on the substrate using the indium source, optionally depositing a gallium material on the substrate using the gallium source, optionally depositing a sulfur material on the substrate using the sulfur source and depositing a selenium material on the substrate using the selenium ink; treating the at least one CIGS precursor layer to form a CIGS material having a formula $Cu_v In_w Ga_x Se_y S_z$; wherein $0.5 \leq v \leq 1.5$ (preferably $0.88 \leq v \leq 0.95$), $0 \leq w \leq 1$ (preferably $0.68 \leq w \leq 0.75$, more preferably w is 0.7), $0 \leq x \leq 1$ (preferably $0.25 \leq x \leq 0.32$, more preferably x is 0.3), $0 < y \leq 2.5$; and, $0 \leq z < 2.5$. Preferably $(w+x)=1$ and $1.8 \leq (y+z) \leq 2.5$. More preferably, the CIGS material prepared has a formula $CuIn_{1-b}Ga_b Se_{2-c} S_c$, wherein $0 \leq b \leq 1$ and $0 \leq c < 2$. The components of the CIGS precursor layer(s) can be treated by known methods to form the CIGS material having formula $Cu_v In_w Ga_x S_y Se_z$. When multiple CIGS precursor layers are applied, the layers can be treated individually or in various combinations. For example, a selenium ink of the present invention and a copper source can be sequentially- or co-deposited on a substrate to form a CIGS precursor layer, followed by heating of the precursor layer to a temperature of 200 to 650° C. for 0.5 to 60 minutes; followed by deposition onto the substrate of another CIGS precursor layer using more selenium ink of the present invention and at least one of an indium source and a gallium source, followed by heating to a temperature of 200 to 650° C. for 0.5 to 60 minutes. In another approach, the components of the CIGS precursor layer(s) are all applied to the substrate before annealing. Annealing temperatures can range from 200 to 650° C. with annealing times of 0.5 to 60 minutes. Optionally, additional selenium can be introduced during the annealing process in the form of at least one of selenium ink of the present invention, selenium powder and hydrogen selenide gas. The CIGS precursor layer(s) can optionally be heated to the annealing temperature by use of a rapid thermal processing protocol, such as with the use of a high-powered quartz lamp, a laser or microwave heating methods. The CIGS precursor layer(s) can optionally be heated to the annealing temperature using traditional heating methods, for example in a furnace.

Optionally, at least two of the copper source, the indium source, the gallium source, the sulfur source and the selenium ink can be combined before using them to deposit material on the substrate. Optionally, at least three of the copper source, the indium source, the gallium source, sulfur source and the selenium ink can be combined before using them to deposit material on the substrate. Optionally, the copper source, the indium source, the gallium source, the sulfur source and the selenium ink are combined before using them to deposit material on the substrate.

Optionally, at least two of the copper material, indium material, gallium material, sulfur material and selenium material are codeposited on the substrate to provide the desired CIGS material composition. The term "codeposited" as used herein and in the appended claims means that the copper material, indium material, gallium material, sulfur material and selenium material that are being codeposited on the substrate are simultaneously deposited on the substrate without the prior combination of the corresponding material sources.

To facilitate the combination of two or more material sources prior to deposition on a substrate or to facilitate the codeposition of two or more material sources, the material sources used are preferably formulated to exhibit similar decomposition temperatures. Preferably, the decomposition temperatures (i.e., boiling point temperatures for the liquid carrier and liquid vehicle(s) in the material sources) of the combined or codeposited material sources are within 50° C., more preferably within 25° C.

Group 1a sources suitable for use in accordance with the present invention include any conventional vehicles for depositing sodium (a Group 1a material) on a substrate using liquid deposition techniques, vacuum-evaporation techniques, chemical vapor deposition techniques, sputtering techniques or any other conventional process for depositing sodium on a substrate. Preferably, the Group 1a source can be incorporated with one or more of the Group 1b source, the Group 3a source, the Group 6a sulfur source or the Group 6a selenium source. That is, sodium can be incorporated into one or more of the Group 1b source, the Group 3a source, the Group 6a sulfur source or the Group 6a selenium source. Alternatively, the sodium may be deposited on a substrate using a separate Group 1a source. For example, sodium salts can be suspended in a suitable liquid carrier for deposition on a substrate. Sodium salts can be selected from $Na_2Se_4$, $Na_2S$, $Na_2Se$, NaHS, NaHSe, and sodium salts of metal chalcogenide clusters.

Group 1b sources suitable for use in accordance with the present invention include any conventional vehicles for depositing a Group 1b material on a substrate using liquid deposition techniques, vacuum-evaporation techniques, chemical vapor deposition techniques, sputtering techniques or any other conventional process for depositing a Group 1b material on the substrate. Preferably, the Group 1b material includes at least one of copper and silver; more preferably copper. Copper sources suitable for use in accordance with the present invention include any conventional vehicles for depositing copper metal onto a substrate using any conventional copper deposition process. Preferably, the copper source includes a copper ink comprising a liquid vehicle and at least one of suspended Cu metal, Cu nanoparticles, copper selenide compounds, copper sulfide compounds, copper oxide, cuprous oxide, organometallic compounds including Cu—Se bonds, organometallic compounds including Cu—S bonds, organometallic compounds including Cu—O bonds, ammonium-copper complexes, copper amidinate complexes, copper guanidinate complexes, copper formate, cuprous formate, copper acetylacetonate, copper ethylhexanoates and copper hexafluoroacetylacetonate; preferably copper formate.

Group 3a sources suitable for use in accordance with the present invention include any conventional vehicles for depositing a Group 3a material on a substrate using liquid deposition techniques, vacuum-evaporation techniques, chemical vapor deposition techniques, sputtering techniques or any other conventional process for depositing a Group 3a material onto a substrate. Preferably, the Group 3a material includes at least one of gallium, indium and aluminum; more preferably gallium and indium. Optionally, the Group 3a source comprises two or more Group 3a sources selected from a gallium source, an indium source and an aluminum source; preferably a gallium source and an indium source. Gallium sources suitable for use in accordance with the present invention include any conventional vehicles for depositing gallium metal onto a substrate using any conventional gallium deposition process. Preferably, the gallium source includes a gallium ink comprising a liquid vehicle and at least one of suspended gallium metal, gallium nanoparticles, gallium selenide compounds, gallium sulfide compounds, gallium oxide compounds, organometallic compounds including Ga—Se bonds, organometallic compounds including Ga—S bonds, organometallic compounds including Ga—O bonds, ammonium-gallium complexes, gallium amidinates, gallium acetylacetonate, gallium ethylhexanoates, and gallium hexafluoroacetylacetonate. Indium sources suitable for use in accordance with the present invention include any conventional vehicles for depositing indium onto a substrate using any conventional indium deposition process. Preferably, the indium source includes an indium ink comprising a liquid vehicle and at least one of suspended indium metal, indium nanoparticles, indium selenide compounds, indium sulfide compounds, indium oxide compounds, organometallic compounds including In-Se bonds, organometallic compounds including In—S bonds, organometallic compounds including In—O bonds, ammonium-indium complexes, indium amidinates, indium acetylacetonate, indium ethylhexanoates and indium hexafluoroacetylacetonate.

Liquid vehicles used in the copper source, the gallium source and the indium source can include amines, amides, alcohols, water, ketones, unsaturated hydrocarbons, saturated hydrocarbons, mineral acids, organic acids, organic bases; preferably alcohols, amines, amides, water, ketone, ether, aldehydes and alkenes.

Group 6a sulfur sources suitable for use in accordance with the present invention include any conventional vehicles for depositing sulfur on a substrate using liquid deposition techniques, vacuum-evaporation techniques, chemical vapor deposition techniques, sputtering techniques or any other conventional process for depositing sulfur onto a substrate. Optionally, the group 6a sulfur source includes a sulfur ink comprising sulfur dissolved in a liquid vehicle. For example, sulfur readily dissolves in amine solvents to form a sulfur ink. Optionally, the group 6a sulfur source can be incorporated with one or more of the Group 1b source, the Group 3a source or the Group 6a selenium source. For example, solution based precursors of sulfur can include metal sulfides, such as, copper sulfide, indium sulfide and gallium sulfide. Accordingly, a given source can comprise both a group 6a sulfur source and a group 1b source (e.g., copper sulfide ink) or group 3a source (e.g., an indium sulfide ink, gallium sulfide ink). Optionally, nanoparticles of sulfur can be formed and used as a group 6a sulfur source to deposit sulfur.

The substrate used can be selected from conventional materials used in conjunction with the preparation of a semiconductor comprising selenium or in conjunction with chalcogenide containing phase change memory devices. For use in some applications, the substrate can be preferably selected from molybdenum, aluminum and copper. For use in the preparation of CIGS materials for use in photovoltaic devices, the substrate is most preferably molybdenum. In some applications, the molybdenum, aluminum or copper substrate can be a coating on a carrier substance, such as, glass, foil, and plastic (e.g., polyethylene terephthalate and polyimides). Optionally, the substrate is sufficiently flexible to facilitate roll-to-roll production of CIGS materials for use in photovoltaic devices.

In the method of the present invention for forming a CIGS material on a substrate, 1 to 20 CIGS precursor layers are deposited on the substrate to form the CIGS material. Preferably 2 to 8, CIGS precursor layers are deposited on the substrate to form the CIGS material. The individual CIGS precursor layers each comprise at least one of a copper, silver, gallium, indium, sulfur and selenium. Optionally, at least one of the CIGS precursor layers comprise at least one Group 1b material selected from copper and silver; at least one Group 3a material selected from gallium and indium and at least one Group 6a material selected from sulfur and selenium.

Using the method of depositing selenium of the present invention, it is possible to provide uniform or graded semiconductor films comprising selenium (e.g., a CIGS material). For example, a graded CIGS material can be prepared by depositing varying concentrations of the components deposited (i.e., by depositing multiple layers of the precursor materials in different compositions). In the preparation of CIGS materials it is sometimes desirable to provide graded films (e.g., with respect to Ga concentration). It is conventional to provide a graded Ga/(Ga+In) ratio as a function of depth in a CIGS material for use in photovoltaic devices to facilitate improved separation of the photogenerated charge carriers and to facilitate reduced recombination at the back contact. Accordingly, it is believed to be desirable to tailor the CIGS material composition to achieve the desired grain structure and the highest efficiency photovoltaic device characteristics.

Some embodiments of the present invention will now be described in detail in the following Examples.

Examples 1-32

Selenium Ink Synthesis

Selenium inks were prepared using the components and amounts identified in Table 1 using the following method.

Selenium powder was weighed out into a reaction vessel in air. For Examples using a solid organic dichalcogenide, the solid organic dichalcogenide was then weighed into the reaction vessel. The reaction vessel was then purged with nitrogen. The liquid carrier was then added without agitation to the reaction vessel using inert techniques in a glove box. For Examples using a liquid organic dichalcogenide, the liquid organic dichalcogenide was then added to the reaction vessel using inert techniques (i.e., via a syringe through a rubber septa). The contents of the reaction vessel were then treated according to the reaction conditions set forth in Table 1. Observations regarding the product formed are provided in Table 1. Formation of a selenium ink was indicated by a distinctive brown color formation in the liquid carrier and a lack of solids on the bottom of the reaction vessel. Note that some selenium inks are air sensitive and will decompose upon exposure to air. Accordingly, the selenium inks were prepared and stored in a nitrogen atmosphere.

TABLE 1

| Ex. | Se (g) | Organic dichalcogenide ("OD") | OD liquid—(l) solid—(s) | Mass OD (g) | Liquid Carrier ("LC") | Mass LC (g) | react. cond. | observ. |
|---|---|---|---|---|---|---|---|---|
| 1 | 0.112 | Dibutyl disulfide | (l) | 0.063 | ethylene diamine | 3.32 | A | B |
| 2 | 0.127 | dibutyl disulfide | (l) | 0.048 | ethylene diamine | 3.32 | A | B |
| 3 | 0.136 | dibutyl disulfide | (l) | 0.039 | ethylene diamine | 3.32 | A | B |
| 4 | 0.088 | diphenyl diselenide | (s) | 0.087 | ethylene diamine | 3.32 | A | C |
| 5 | 0.105 | diphenyl diselenide | (s) | 0.070 | ethylene diamine | 3.32 | A | C |
| 6 | 0.117 | diphenyl diselenide | (s) | 0.058 | ethylene diamine | 3.32 | A | C |
| 7 | 0.361 | dibutyl disulfide | (l) | 0.163 | ethylene diamine | 2.98 | D | B |
| 8 | 0.246 | dibutyl disulfide | (l) | 0.111 | ethylene diamine | 3.14 | D | B |
| 9 | 0.175 | dibutyl disulfide | (l) | 0.066 | ethylene diamine | 3.23 | E | B |
| 10 | 0.350 | dibutyl disulfide | (l) | 0.198 | ethylene diamine | 2.95 | E | B |
| 11 | 0.525 | dibutyl disulfide | (l) | 0.296 | ethylene diamine | 2.68 | E | B |
| 12 | 0.700 | dibutyl disulfide | (l) | 0.395 | ethylene diamine | 2.40 | E | B |
| 13 | 0.876 | dibutyl disulfide | (l) | 0.494 | ethylene diamine | 2.13 | E | F |
| 14 | 1.05 | dibutyl disulfide | (l) | 0.593 | ethylene diamine | 1.86 | E | F |
| 15 | 1.40 | dibutyl disulfide | (l) | 0.791 | ethylene diamine | 1.31 | E | F |
| 16 | 0.525 | dibutyl disulfide | (l) | 0.148 | ethylene diamine | 2.83 | E | B |
| 17 | 0.164 | dibutyl disulfide | (l) | 0.046 | ethylene diamine | 3.29 | E | B |
| 18 | 0.143 | dibutyl disulfide | (l) | 0.032 | ethylene diamine | 3.33 | E | B |
| 19 | 0.151 | dibutyl disulfide | (l) | 0.024 | ethylene diamine | 3.33 | E | B |
| 20 | 0.112 | dibutyl disulfide | (l) | 0.063 | hexylamine | 3.33 | E | I |
| 21 | 0.112 | dibutyl disulfide | (l) | 0.063 | tetramethyl guanidine | 3.33 | E | B |
| 22 | 0.112 | dibutyl disulfide | (l) | 0.063 | pyridine | 3.33 | E | J |
| 23 | 0.112 | dibutyl disulfide | (l) | 0.063 | 1-methyl imidazole | 3.33 | E | B |
| 24 | 0.112 | dibutyl disulfide | (l) | 0.063 | xylenes | 3.33 | E | I |
| 25 | 0.104 | dibutyl disulfide | (s) | 0.072 | ethylene diamine | 3.33 | E | B |
| 26 | 0.104 | dibutyl disulfide | (s) | 0.072 | xylenes | 3.33 | E | K |
| 27 | 0.127 | diisopropyl disulfide | (l) | 0.048 | ethylene diamine | 3.33 | E | B |
| 28 | 0.127 | diisopropyl disulfide | (l) | 0.048 | n-hexyl amine | 3.33 | E | L |
| 29 | 0.112 | di-t-butyl disulfide | (l) | 0.063 | ethylene diamine | 3.33 | E | B |
| 30 | 0.112 | di-t-butyl disulfide | (l) | 0.063 | n-hexyl amine | 3.33 | E | L |
| 31 | 0.118 | 2-hydroxyethyl disulfide | (l) | 0.057 | ethylene diamine | 3.33 | E | B |

TABLE 1-continued

| Ex. | Se (g) | Organic di-chalcogenide ("OD") | OD liquid—(l) solid—(s) | Mass OD (g) | Liquid Carrier ("LC") | Mass LC (g) | react. cond. | observ. |
|---|---|---|---|---|---|---|---|---|
| 32 | 0.118 | 2-hydroxyethyl disulfide | (l) | 0.057 | diethylene glycol dimethyl ether | 3.33 | E | I |

A. Heated contents of reaction vessel on hot plate set at 120° C. for 6.5 hours; then raised hot plate set point temperature to 130° C. and continued heating for 2 more hours.
B. Brown solution. No solids observed upon reaction completion.
C. Partial dissolution. Some solids on bottom of reaction vessel upon reaction completion
D. Heated contents of reaction vessel on hot plate set at 80° C. for 2 hours; raised hot plate set point temperature to 125° C. and continued heating for 2.3 hrs; raised hot plate set point temperature to 135° C. and continued heating for 3.2 hrs.
E. Heated contents of reaction vessel on hot plate set at 120° C. for 4 hours; raised hot plate set point temperature to 130° C. for 8 hrs.
F. Brown solution. No solids observed upon reaction completion. Clear phase separates from brown solution over time.
I. Clear solution. Selenium did not substantially dissolve into solution.
J. Very slight brown solution. Slight amount of selenium dissolved.
K. Clear solution. Selenium did not substantially dissolve into solution.
L. Brown solution. Some solids remained upon reaction completion, not completely dissolved.

Examples 33-49

Filtration

The selenium inks prepared according to the Examples noted in Table 2 were filtered through a 1.2 micron glass syringe filter following synthesis of the ink with the result noted in Table 2.

TABLE 2

| Ex. | Se Ink of Ex. | Hold Time | Filter size (in μ) | Result |
|---|---|---|---|---|
| 33 | 9 | 16 hrs | 1.2 | M |
| 34 | 10 | 16 hrs | 1.2 | M |
| 35 | 11 | 16 hrs | 1.2 | M |
| 36 | 12 | 16 hrs | 1.2 | M |
| 37 | 13 | 16 hrs | 1.2 | M |
| 38 | 14 | 16 hrs | 1.2 | M |
| 39 | 15 | 16 hrs | 1.2 | M |
| 40 | 16 | 16 hrs | 1.2 | M |
| 41 | 17 | 16 hrs | 1.2 | M |
| 42 | 18 | 16 hrs | 1.2 | M |
| 43 | 19 | 16 hrs | 1.2 | M |
| 44 | 21 | 16 hrs | 1.2 | M |
| 45 | 23 | 16 hrs | 1.2 | M |
| 46 | 25 | 16 hrs | 1.2 | M |
| 47 | 27 | 16 hrs | 1.2 | M |
| 48 | 29 | 16 hrs | 1.2 | M |
| 49 | 31 | 16 hrs | 1.2 | M |

M. No aggregation or settling observed following the noted hold time. The selenium ink passed through the filter with no hold up (i.e., all material passed through the filter).

Example 50

Preparation of Selenide Film on Molybdenum Substrate

The following procedure was performed in a glove box under a nitrogen atmosphere. A molybdenum foil substrate was preheated on a hotplate set at 120° C. Several drops of the selenium ink prepared according to Example 2 were deposited on the preheated molybdenum foil substrate. The hotplate temperature set point was retained at 120° C. for five minutes following deposition of the selenium ink. The hotplate temperature set point was then increased to 220° C. and held there for five minutes. The molybdenum substrate was then removed from the hotplate and allowed to cool. The substrate was then removed from the hotplate and allowed to cool to room temperature. The resulting product was analyzed by x-ray defraction (2-theta scan) using a Rigaku D/MAX 2500 at 50 kV/200 mA of nickel filtered copper Kα radiation. The sample was scanned from 5 to 90 degrees of 2θ in steps of 0.03 degrees at 0.75 degrees/minute. Reflection geometry was used and the sample was rotated at 20 RPM. The scan output was then compared with scans for compounds in standard crystallography databases to verify that crystalline selenium was formed on the surface of the substrate.

Example 51

Preparation of Copper Selenide Film on Copper Substrate

The following procedure was performed in a glove box under a nitrogen atmosphere. A copper foil substrate was preheated on a hotplate set at 100° C. Several drops of the selenium ink prepared according to Example 2 were deposited on the preheated copper foil substrate. The hotplate temperature set point was retained at 100° C. for five minutes following deposition of the selenium ink. The hotplate set point temperature was then raised to 220° C. and held there for five minutes. The hotplate set point temperature was then raised to 298° C. and held there for five minutes. The substrate was then removed from the hotplate and allowed to cool to room temperature. The resulting product was analyzed by x-ray defraction (2-theta scan) using a Rigaku D/MAX 2500 at 50 kV/200 mA of nickel filtered copper Kα radiation. The samples were scanned from 5 to 90 degrees of 2θ in steps of 0.03 degrees at 0.75 degrees/minute. Reflection geometry was used and samples were rotated at 20 RPM. The scan output was then compared with scans for compounds in standard crystallography databases to verify that copper selenide was formed on the surface of the substrate.

Example 52

Preparation of Copper Selenide Film on Molybdenum Substrate

The following procedure was performed in a glove box under a nitrogen atmosphere. A molybdenum foil substrate was preheated on a hotplate set at 100° C. A copper ink was prepared by dissolving 0.50 g of copper(II) acetylacetonate in 9.5 g of ethylene diamine with stirring at 40° C. until the copper (II) acetylacetonate dissolved. One drop of the selenium ink prepared according to Example 2 was deposited with four drops of the copper ink on the molybdenum foil substrate. The hotplate temperature set point was retained at 100° C. for five minutes following deposition of the inks. The hotplate set point temperature was then raised to 220° C. and held there for five minutes. The hotplate set point temperature was then raised to 298° C. and held there for five minutes. The substrate was then removed from the hotplate and allowed to cool to room temperature. The resulting product was analyzed by x-ray defraction (2-theta scan) using the same equipment and settings noted in Example 51. The scan output was then compared with scans for compounds in standard crystallography databases to verify that copper selenide was formed on the surface of the substrate.

Example 53

Preparation of Copper Selenide Film on Molybdenum Substrate

The following procedure was performed in a glove box under a nitrogen atmosphere. A molybdenum foil substrate was preheated on a hotplate set at 100° C. A copper ink was prepared by dissolving 0.35 g of copper(II) ethylhexanoate in 6.65 g of hexylamine with stirring at 40° C. until the copper (II) ethylhexanoate dissolved. One drop of the selenium ink prepared according to Example 2 was deposited with four drops of the copper ink on the molybdenum foil substrate. The hotplate temperature set point was retained at 100° C. for five minutes following deposition of the inks. The hotplate set point temperature was then raised to 220° C. and held there for five minutes. The hotplate set point temperature was then raised to 298° C. and held there for five minutes. The substrate was then removed from the hotplate and allowed to cool to room temperature. The resulting product was analyzed by x-ray defraction (2-theta scan) using the same equipment and settings noted in Example 51. The scan output was then compared with scans for compounds in standard crystallography databases to verify that copper selenide was formed on the surface of the substrate.

Example 54

Preparation of Copper Selenide Film on Molybdenum Substrate

The following procedure was performed in a glove box under a nitrogen atmosphere. A molybdenum foil substrate was preheated on a hotplate set at 100° C. A copper ink was prepared by dissolving 1.59 g of copper(II) formate in 7.37 g of n-butylamine with stirring at 40° C. until the copper (II) formate dissolved. One drop of the selenium ink prepared according to Example 2 was deposited with four drops of the copper ink on the molybdenum foil substrate. The hotplate temperature set point was retained at 100° C. for five minutes following deposition of the inks. The hotplate set point temperature was then raised to 220° C. and held there for five minutes. The hotplate set point temperature was then raised to 298° C. and held there for five minutes. The substrate was then removed from the hotplate and allowed to cool to room temperature. The resulting product was analyzed by x-ray defraction (2-theta scan) using the same equipment and settings noted in Example 51. The scan output was then compared with scans for compounds in standard crystallography databases to verify that copper selenide was formed on the surface of the substrate.

We claim:

1. A method for preparing a Group 1a-1b-3a-6a material, comprising:
providing a substrate;
optionally, providing a Group 1a source comprising sodium;
providing a Group 1b source;
providing a Group 3a source;
optionally, providing a Group 6a sulfur source;
providing a Group 6a selenium source, wherein the Group 6a selenium source includes a selenium ink, comprising:
a chemical compound having a formula $RZ-Se_x-Z'R'$; wherein Z and Z' are each independently selected from the group consisting of sulfur, selenium and tellurium; wherein x is 2 to 20; wherein R is selected from the group consisting of H, $C_{1-20}$ alkyl group, a $C_{6-20}$ aryl group, a $C_{1-20}$ alkylhydroxy group, an arylether group and an alkylether group; wherein R' is selected from the group consisting of a $C_{1-20}$ alkyl group, a $C_{6-20}$ aryl group, a $C_{1-20}$ alkylhydroxy group, an arylether group and an alkylether group; and
a liquid carrier, wherein the liquid carrier is a nitrogen containing solvent;
wherein the selenium ink comprises >1 wt % selenium; wherein the selenium ink is stable and wherein the selenium ink is hydrazine and hydrazinium free;
forming at least one Group 1a-1b-3a-6a precursor material on the substrate by optionally using the Group 1a source to apply sodium to the substrate, using the Group 1b source to apply a Group 1b material to the substrate, using the Group 3a source to apply a Group 3a material to the substrate, optionally using the Group 6a sulfur source to apply a sulfur material to the substrate and using the Group 6a selenium source to apply a selenium material to the substrate;
treating the precursor material to form a Group 1a-1b-3a-6a material having a formula $Na_L X_m Y_n S_p Se_q$;
wherein X is at least one Group 1b element selected from copper and silver; Y is at least one Group 3a element selected from aluminum, gallium and indium; $0 \leq L \leq 0.75$; $0.25 \leq m \leq 1.5$; n is 1; $0 \leq p < 2.5$; $0 < q \leq 2.5$; and, $1.8 \leq (p+q) \leq 2.5$.

2. The method of claim 1, wherein Z and Z' are both sulfur.

3. The method of claim 1, wherein Z and Z' are both Selenium; and wherein R and R' are each independently selected from the group consisting of a phenyl group, a methyl group, an ethyl group, a propyl group, a butyl group, an isopropyl group and a tert-butyl group.

4. The method a claim 1, wherein Z and Z' are both sulfur; and wherein R and R' are each independently selected from the group consisting of a phenyl group, a methyl group, an ethyl group, as propyl group, a butyl group, an isopropyl group and a tert-butyl group.

5. The method of claim 1, wherein the liquid carrier is a liquid amine having a formula $NR_3$, wherein each R is independently selected from the group consisting of a H, a $C_{1-10}$ alkyl group, a $C_{6-10}$ aryl group and a $C_{1-10}$ alkylamino group.

6. The method of claim 1, wherein the liquid carrier is selected from the group consisting of ethylene diamine, diethylenetriamine, triethylenetetramine, n-butylamine, n-hexylamine, octylamine, 2-ethyl-1-hexylamine, 3-amino-1-propanol, pyridine, pyrrolidine and tetramethylguanidine.

* * * * *